(12) United States Patent
Médard et al.

(10) Patent No.: US 8,482,441 B2
(45) Date of Patent: Jul. 9, 2013

(54) METHOD AND APPARATUS TO PERFORM FUNCTIONAL COMPRESSION

(75) Inventors: Muriel Médard, Belmont, MA (US);
Soheil Feizi-Khankandi, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 13/486,369

(22) Filed: Jun. 1, 2012

(65) Prior Publication Data
US 2012/0307920 A1     Dec. 6, 2012

Related U.S. Application Data

(60) Provisional application No. 61/492,864, filed on Jun. 3, 2011.

(51) Int. Cl.
*H03M 7/00*     (2006.01)
(52) U.S. Cl.
USPC ............. 341/107; 341/65; 341/67; 341/97; 341/106
(58) Field of Classification Search
USPC ................. 341/65, 67, 79, 106, 107
See application file for complete search history.

(56) References Cited

U.S. PATENT DOCUMENTS

| | | | | |
|---|---|---|---|---|
| 6,128,773 A | * | 10/2000 | Snider | 717/132 |
| 7,064,489 B2 | * | 6/2006 | Price | 314/65 |
| 7,071,853 B2 | * | 7/2006 | Price | 341/65 |
| 7,095,343 B2 | * | 8/2006 | Xie et al. | 341/107 |
| 7,821,980 B2 | * | 10/2010 | Chakrabarti et al. | 370/315 |
| 7,945,842 B2 | * | 5/2011 | He et al. | 714/779 |
| 2003/0055614 A1 | * | 3/2003 | Pelikan et al. | 703/2 |
| 2008/0320363 A1 | * | 12/2008 | He et al. | 714/758 |
| 2009/0313459 A1 | * | 12/2009 | Horvath | 712/225 |

OTHER PUBLICATIONS

Feizi, et al.; "On Network Functional Compression;" arXiv online repository; URL: http://arxiv.org/pdf/1011.5496v2.pdf; Nov. 30, 2010p pp. 1-60.
Feizi, et al; "Cases Where Finding a Minimum Entrophy Coloring of a Characteristic Graph is a Polynomial Time Problem;" IEEE International Symposium on Information Theory; Jun. 13, 2010; pp. 116-120.
Cardinal, et al; "Minimum Entrophy Combinatorial Optimization Problems;" Data Structure and Algorithms, Discrete Mathematics; Aug. 17, 2010; pp. 1-16.
Feizi, et al.; "When Do Only Sources Need to Compute? On Fuctional Compression in Tree Networks;" 47th Annual Allerton Conference, IEEE; Sep. 30, 2009; pp. 447-454.
PCT Search Report of the ISA for PCT/US2012/040401 dated Mar. 4, 2013.
Written Opinion of the ISA for PCT/US2012/040401 dated Mar. 4, 2013.

* cited by examiner

*Primary Examiner* — Linh Nguyen
(74) *Attorney, Agent, or Firm* — Daly, Crowley, Mofford & Durkee, LLP

(57) ABSTRACT

A functional compression scheme involves determining a minimal entropy coloring of a characteristic graph of a random variable. Various scenarios are disclosed where the determination of the minimal entropy coloring of a characteristic graph is easy and tractable.

15 Claims, 6 Drawing Sheets

METHOD AND APPARATUS TO PERFORM FUNCTIONAL COMPRESSION

CROSS REFERENCE TO RELATED APPLICATIONS

This application claims the benefit of U.S. Provisional Application No. 61/492,864 filed Jun. 3, 2011 under 35 U.S.C. §119(e) which application is hereby incorporated herein by reference in its entirety.

FIELD

Subject matter disclosed herein relates in general to data transmission and, more particularly, to transmission of data in a compressed form.

BACKGROUND

Traditional data compression involves the compression of data at a source (e.g., at a transmitter node) and the reconstruction of the data at a destination (e.g., at a terminal node). Functional compression is a form of data compression where data is compressed at one or more sources, but only a function of the original data is computed at a destination, rather than a full reconstruction of the original data. By only requiring a function of the original data to be computed at the receiver, a higher level of compression may often be achieved over traditional compression techniques. Techniques are needed for effectively implementing functional compression.

SUMMARY

In accordance with the concepts, systems, circuits, and techniques described herein, a method is provided for compressing and transmitting data at a node of a network having multiple source nodes that each generate a random variable and that are to transmit information to a receiver node that will allow the receiver node to calculate a function of the random variables. More specifically, the method comprises generating a characteristic graph for a random variable associated with a first node of the network with respect to random variables associated with other nodes of the network, a joint probability distribution between random variables of the network, and the function of the random variables that is to be computed at the receiver node, wherein the vertices of the characteristic graph are the possible values of the random variable associated with the first node. The method also comprises determining a minimum entropy coloring of the characteristic graph for the random variable associated with the first node, wherein determining a minimum entropy coloring of the characteristic graph includes: identifying maximal independent sets of the characteristic graph for the random variable associated with the first node; and assigning a different color to the vertices of each identified maximal independent set. In addition, the method comprises: encoding the minimum entropy coloring of the characteristic graph to generate an encoded minimum entropy coloring of the characteristic graph; and transmitting the encoded minimum entropy coloring of the characteristic graph for the random variable associated with the first node to another node in the network.

In accordance with a further aspect of the concepts, systems, circuits and techniques described herein, a node device is provided for use in a network having multiple source nodes and a receiver node, where the multiple source nodes are each to generate a random variable and to transmit information to the receiver node that will allow the receiver node to calculate a function of the random variables. More specifically, the node device comprises a first processor to generate a characteristic graph for a random variable with respect to other random variables in a network, the joint probability distributions $p(x_1, x_2)$ between random variables, and a network function to be calculated at a terminal node. The node device may also include a second processor to determine a minimum entropy coloring of the characteristic graph, wherein the second processor determines the minimum entropy coloring by first identifying maximal independent sets of the characteristic graph for the random variable and then assigning a different color to the vertices of each identified maximal independent set. In addition, the node device may include an encoder to encode the minimum entropy coloring of the characteristic graph to generate an encoded minimum entropy coloring and a transmitter to transmit the encoded minimum entropy coloring to another node in the network.

BRIEF DESCRIPTION OF THE DRAWINGS

The foregoing features of this invention, as well as the invention itself, may be more fully understood from the following description of the drawings in which.

DETAILED DESCRIPTION

Figure 1:
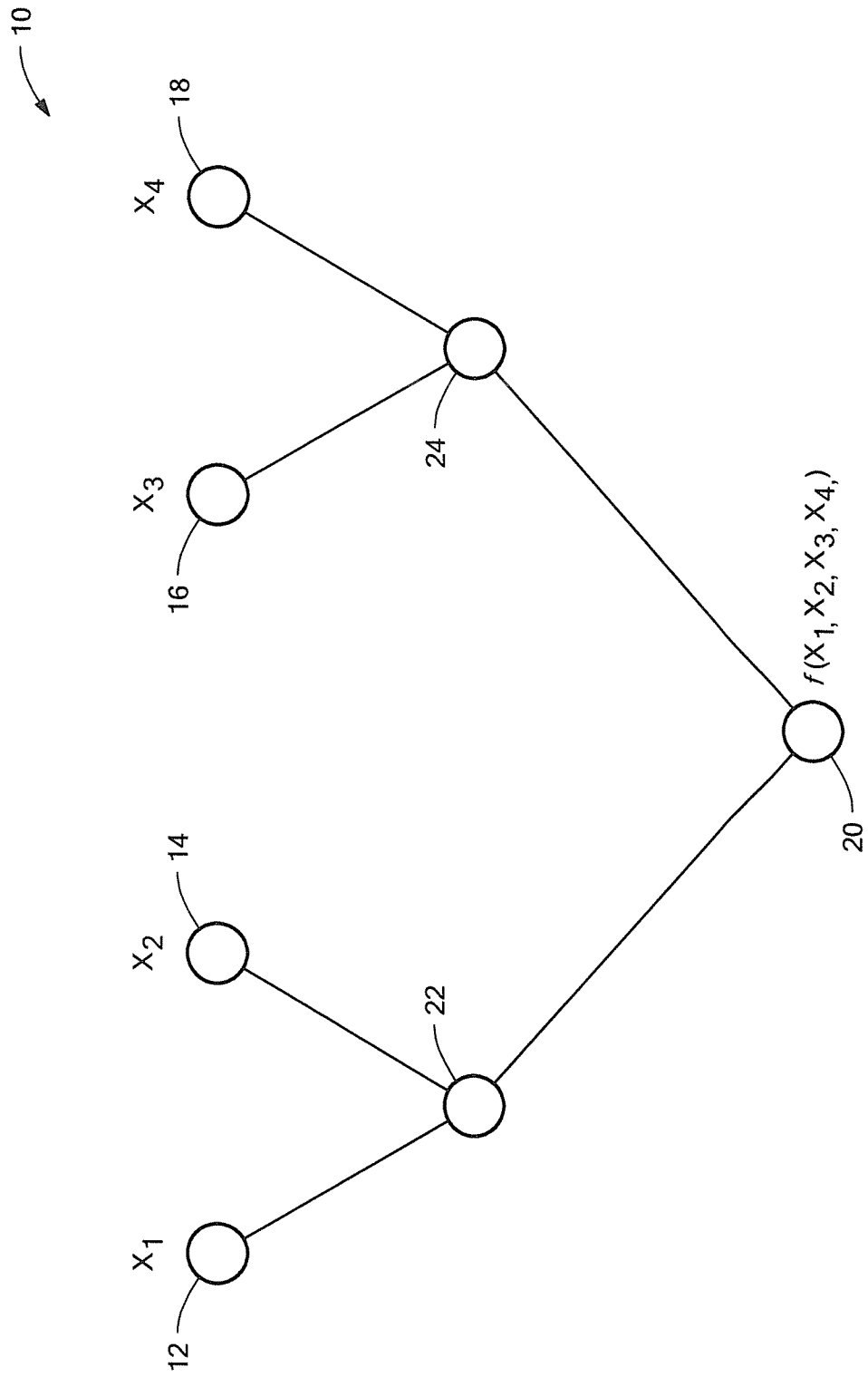
FIG. 1 is a schematic diagram illustrating an example network that may utilize functional compression in accordance with an implementation.

FIG. 1 is a schematic diagram illustrating an example network 10 that may utilize functional compression in accordance with one or more implementations. As illustrated, the network 10 may include: a number of source nodes 12, 14, 16, 18; one or more intermediate nodes 22, 24; and a terminal (receiver) node 20. The source nodes 12, 14, 16, 18 may have random variables associated with them (e.g., $X_1, X_2, X_3,$ and $X_4$, respectively) that are of interest to the remote terminal node 20. To satisfy the terminal node's desire for information, the source nodes 12, 14, 16, 18 can each transmit their respective random variables to terminal node 20 through network 10. Intermediate nodes 22, 24 may be used as relay nodes to relay the data from source nodes 12, 14, 16, 18 to terminal node 20. To reduce data traffic levels in network 10, or for some other reason, it may be desirable to compress the random variable information before it is transmitted from the source nodes 12, 14, 16, 18. If traditional compression techniques are used to compress the random variable data, the data can be recovered in full at terminal node 20 by decompressing the received signals.

In some situations, terminal node 20 may not need to know the values of the random variables themselves, but only a function of the variables (i.e., $f(X_1, X_2, X_3, X_4)$). In these situations, it might be possible to achieve a greater level of data compression than would be possible using traditional compression techniques. This type of compression is known as "functional compression." For example, in one possible scenario, source nodes 12, 14, 16, 18 may each include a temperature sensor that is monitoring temperature in a region of interest. The random variable at each node is the temperature reading. Terminal node 20 may only be interested in the average temperature in the region of interest, and not the individual temperature readings of the sensors. The function generated at terminal node 20 may therefore include, for example, an average of the random variables $X_1, X_2, X_3, X_4$ associated with source nodes 12, 14, 16, 18. As will be appreciated, any number of different random variable types and network function types may be used in different implementations.

To implement functional compression, encoding techniques need to be developed to encode and compress the data at the source nodes 12, 14, 16, 18 and/or the intermediate nodes 22, 24. These encoding techniques need to take into consideration both the joint probability distribution between the various random variables of the network as well as the function that will ultimately be computed at terminal node 20. As will be appreciated, to be practical, the encoding techniques must be executable in a realistic time frame that allow them to be used in carrying out real world applications. In addition, the encoding techniques have to be accurate and reliable, so that the function computed at terminal node 20 can be trusted. In one aspect described herein, novel techniques for encoding data at nodes of a network for use in supporting functional compression are provided.

As described above, network 10 may include one or more intermediate nodes 22, 24 between source nodes 12, 14, 16, 18 and terminal node 20. These intermediate nodes 22, 24 may act as relay nodes to transfer data to terminal node 20. In some implementations, the intermediate nodes 22, 24 may perform sub-computations that are related to the ultimate function to be computed at terminal node 20. These sub-computations may each represent, for example, a portion of the network function to be computed at terminal node 20. For example, if the network function at terminal node 20 is a sum or average of all of the random variables associated with source nodes 12, 14, 16, 18, then the sub-computations at intermediate nodes 22, 24 may include sums of subsets of the random variables (e.g., $X_1+X_2$ at intermediate node 22 and $X_3+X_4$ at intermediate node 24, etc.). As will be appreciated, any number of different sub-computations may be used at intermediate nodes in different implementations. In addition to the compression of random variable data at source nodes 12, 14, 16, 18 of network 10, it may also be desirable to compress sub-computation data at intermediate nodes 22, 24.

It should be appreciated that network 10 of FIG. 1 represents one example network arrangement that may benefit from use of the techniques, systems, and concepts described herein. Many alternative network architectures may also be used. Network 10 if FIG. 1 is an example of a tree network. It should be appreciated, however, that the techniques, systems, and concepts described herein may also be used in networks having other network topologies. The techniques described herein may be implemented in networks having any number of nodes. In some implementations, no intermediate nodes may be present in a network. In other implementations, multiple levels of intermediate nodes may be present. The network function that is computed at terminal node 20 will typically be application specific. Likewise, the type of source node information that is being transferred will typically be application specific. In implementations using intermediate nodes, sub-computations may or may not be used. When sub-computations are used, the particular sub-computations that are computed may be selected to facilitate the compression process and efficiently distribute the computation function among the nodes.

Figure 2:
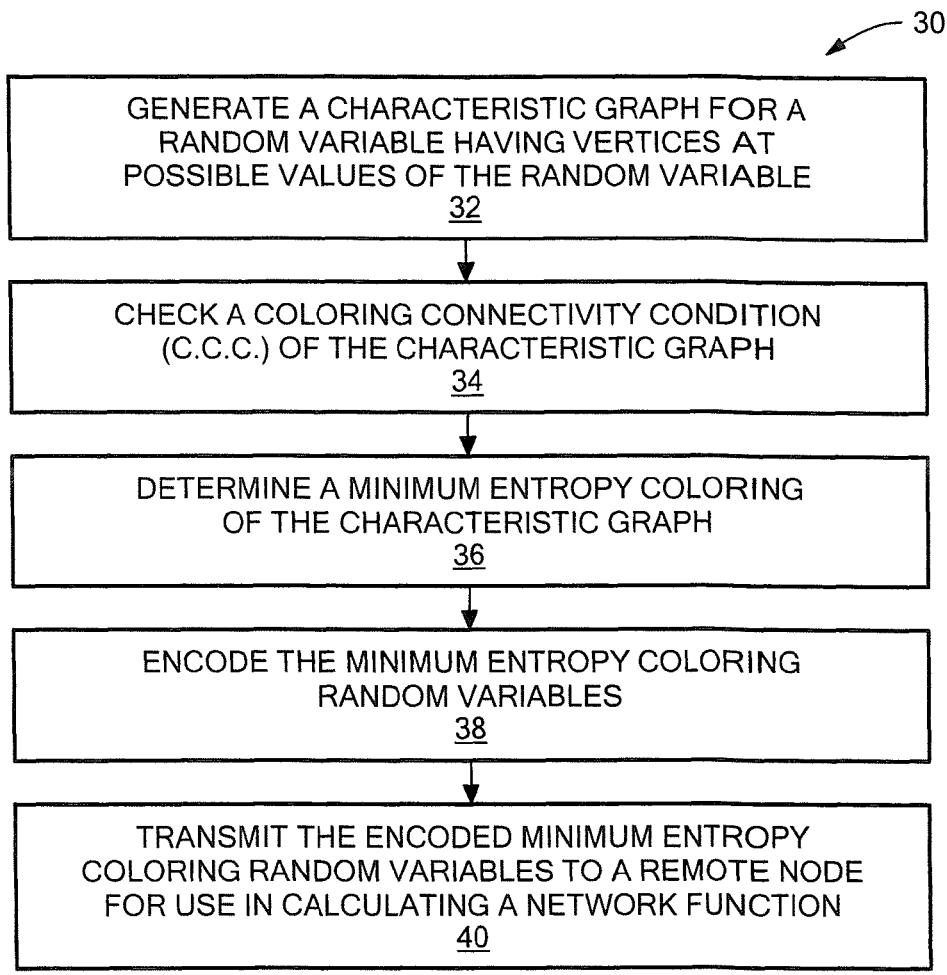
FIG. 2 is a flow diagram illustrating a method for performing functional compression in accordance with an implementation.

FIG. 2 is a flow diagram showing an example process for performing functional compression in accordance with an implementation.

The rectangular elements (typified by element 32 in FIG. 2) are herein denoted "processing blocks" and may represent computer software instructions or groups of instructions. It should be noted that the flow diagram of FIG. 2 represents one exemplary embodiment of the design described herein and variations in such a diagram, which generally follow the process outlined, are considered to be within the scope of the concepts, systems, and techniques described and claimed herein.

Alternatively, the processing blocks of FIG. 2 (and other flow diagrams provided herein) may represent operations performed by functionally equivalent circuits, such as a digital signal processor circuit, an application specific integrated circuit (ASIC), a field programmable gate array (FPGA), and/or others. The flow diagram does not necessarily depict the syntax of any particular programming language. Rather, the diagram illustrates the functional information one of ordinary skill in the art may require to, for example, fabricate circuits and/or generate computer software to perform the processing required of a particular apparatus. It should be noted that many routine program elements, such as initialization of loops and variables and the use of temporary variables may not be shown. It will be appreciated by those of ordinary skill in the art that unless otherwise indicated herein, the particular sequence described is illustrative only and can be varied without departing from the spirit of the concepts described and/or claimed herein. Thus, unless otherwise stated, the processes described below are unordered meaning that, when possible, the sequences shown in FIG. 2 and in other flow diagrams can be performed in any convenient or desirable order.

Turning now to FIG. 2, a method 30 for performing functional compression in accordance with an implementation will now be described. The method 30 will be described in the context of acts performed at a single node of a network. It should be appreciated that a similar process may be performed at each of the relevant nodes of a network so that, ultimately, a network function may be accurately computed at a terminal node. The method 30 may be performed at source nodes and/or intermediate nodes of a network. First, a characteristic graph is generated for a random variable associated with a node (block 32). As will be described in greater detail, the characteristic graph is generated with respect to the other random variables in the network, the joint probability distributions $p(x_1, x_2)$ between the random variables, and the network function to be calculated at the terminal node. A characteristic graph of a random variable is a mathematical structure that includes "vertices" corresponding to possible values of the random variable and "edges" interconnecting certain pairs of the vertices. A characteristic graph may be represented mathematically and/or graphically.

After a characteristic graph has been generated, a coloring connectivity condition (C.C.C.) may be checked for the graph (block 34). To better explain the coloring connectivity condition, a joint-coloring family $J_C$ will first be defined. A joint-coloring family $J_C$ for random variables $X_1, \ldots, X_k$ with characteristic graphs $G_{X_1}, \ldots, G_{X_k}$, and any valid colorings $$c_{G_{X_1}}, \ldots, c_{G_{X_k}},$$

respectively, is defined as:

$$J_C = \{j_c^1, \ldots j_c^{n_{jc}}\}$$

where $$j_c^i = \left\{(x_1^{i_1}, x_2^{i_2}, \ldots, x_{2k}^{i_k}) : c_{G_{X_1}}(x_1^{i_1}) = c_{G_{X_2}}(x_2^{i_2}) = \ldots = c_{G_{X_k}}(x_k^{i_k})\right\}$$

for any valid $i_1, \ldots i_k$, and $$n_{j_c} = |c_{G_{X_1}}| \times |c_{G_{X_2}}| \times \ldots \times |c_{G_{X_k}}|.$$

Each $j_c^i$ will be referred to herein as a joint coloring class. Given the above definition of a joint-coloring family, the coloring connectivity condition may be defined as follows. Consider random variables $X_1, \ldots, X_k$ with characteristic graphs $G_{X_1}^n, \ldots, G_{X_k}^n$, and any valid colorings $$c_{G_{X_1}^n}, \ldots, c_{G_{X_k}^n}.$$

These colorings satisfy the Coloring Connectivity Condition (C.C.C.) when, between any two points in $j_c^i \in J_C$, there exists a path that lies in $j_c^i$, or function $f$ has the same value in disconnected parts of $j_c^i$. In some implementations, the coloring connectivity condition step may be optional.

If the C.C.C. is satisfied, a minimum entropy coloring of the characteristic graph may next be determined (block 36). A "coloring" of a graph is an assignment of labels or "colors" to the vertices of the graph so that no two vertices that are interconnected by an edge have the same color. A minimum entropy coloring is a coloring that uses a minimal number of colors. When characterizing a source, the number of bits required to describe the source is the entropy. It has been found that the minimum entropy coloring of a characteristic graph provides the most compressed and distributed representation of a network function that allows its computation at the terminal node. That is, the minimum entropy coloring provides the minimum possible rate from which the network function can be computed. The minimum entropy coloring of a graph will typically include a list of the colors used in the coloring.

After the minimum entropy coloring has been determined, the coloring random variables may be encoded using a Slepian-Wolf encoder or similar encoder (block 38). The encoded coloring random variables may then be transmitted to a next node in the network for eventual use in calculating a network function (block 40). When the encoded minimum entropy coloring information is received at the terminal node, a decoder (e.g., a Slepian-Wolf decoder, etc.) may be used to recover the minimum entropy coloring information for use in computing the network function. A lookup table may then be used by the terminal node to map the colors to the actual source values.

For an arbitrary graph, the determination of the minimum entropy coloring of the graph is an NP-hard problem, where NP-hard is a measure of computational complexity. An NP-hard problem is typically difficult or impossible to solve within a time frame that would make it practical for use in a real world application. However, it has been found that, in certain situations, the determination of the minimum entropy coloring of a characteristic graph is not NP-hard, but is tractable and practical. In one case, for example, it has been determined that when the joint probability condition of the various random variables of a system is non-zero for all possible variable combinations, the determination of the minimum entropy coloring becomes relatively straightforward and can be performed in polynomial time. In another example situation, it has been found that when the network function that is being computed in the terminal node is a quantization function, the determination of the minimum entropy coloring can likewise be performed in polynomial time.

Figure 3:
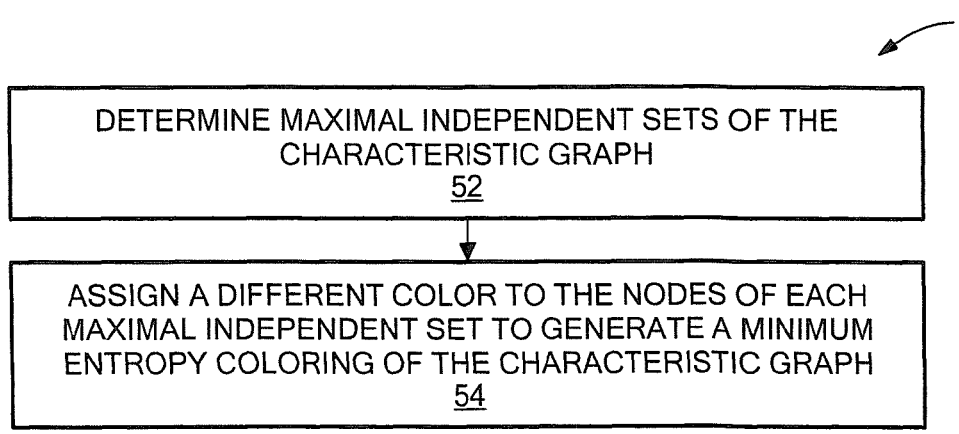
FIG. 3 is a block diagram illustrating an example method for determining a minimum entropy coloring of a characteristic graph in accordance with an implementation.

FIG. 3 is a block diagram illustrating an example method 50 for determining a minimum entropy coloring of a characteristic graph in accordance with an implementation. Method 50 may be used, for example, as part of method 30 of FIG. 2 to determine the minimum entropy coloring of a characteristic graph for use in performing functional compression in certain situations. Method 50 may be used in situations where, as described above, the joint probability condition of the various random variables of a system is non-zero for all possible variable combinations. Likewise, method 50 may be used in situations where, as described above, a network function being computed in a terminal node is a quantization function. Referring now to FIG. 3, to determine the minimum entropy coloring of a characteristic graph, the maximal independent sets of the characteristic graph are first determined (block 52). After the maximal independent sets have been determined, a different color is assigned to the nodes of each maximal independent set of the characteristic graph (block 54). The set of colors assigned to the nodes of each maximal independent set is the minimum entropy coloring of the characteristic graph.

An "independent set" of a graph is a set of vertices in the graph where no two vertices in the set are interconnected by an edge. A "maximal independent set" of a graph is an independent set that cannot be made any larger without including an edge between two vertices. That is, there is no other vertex in the graph that can be added to the "maximal independent set" that will allow it to remain an "independent set." It has been found that, in both situations described above, the maximal independent sets of a characteristic graph will consist of non-overlapping, fully connected sets. In a functional compression application, once colors have been assigned to the maximal independent sets of a characteristic graph, the color scheme may be encoded (using, for example, Slepian-Wolf encoding) and then transmitted to a next node in the network as compressed data. As described previously, this process may be performed in polynomial time.

Figure 4:
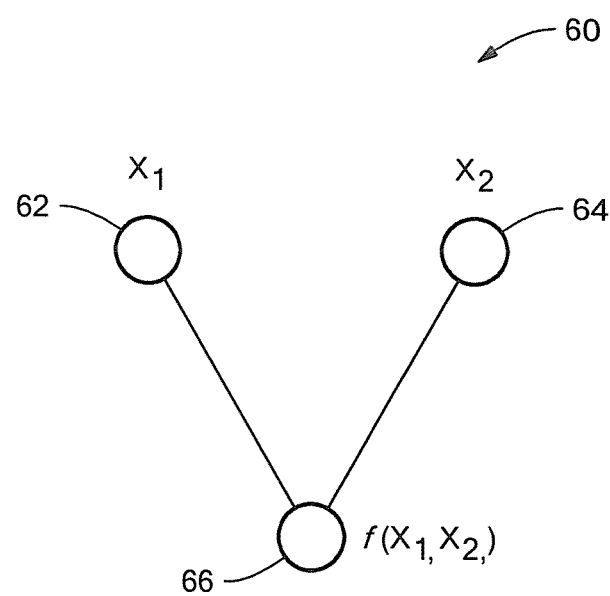
FIG. 4 is a schematic diagram illustrating a simple network configuration that is used to define various terms in accordance with an implementation.

In the discussion that follows, various concepts and terms used hereinabove are described in greater detail. To facilitate understanding, the descriptions are made with reference to the simplified network configuration 60 of FIG. 4. The descriptions are easily extended to networks having a greater number of source nodes and or networks having one or more intermediate stages between the source nodes and the terminal node. As illustrated in FIG. 4, first and second source nodes 62, 64 have corresponding random variables $X_1$, $X_2$. The source nodes 62, 64 are transmitting to a terminal node 66 that calculates a function $f(X_1, X_2)$. It will be assumed that the random variables of source nodes 62, 64 are drawn from finite sets $\chi_1 = \{x_1^1, x_1^2, \ldots, x_1^{|\chi_1|}\}$ and $\chi_2 = \{x_2^1, x_2^2, \ldots, x_2^{|\chi_2|}\}$. These sources have a joint probability distribution $p(x_1, x_k)$. As used herein, n-sequences of these random variables may be expressed as:

$$X_1 = \{X_1^i\}_{i=l}^{i=l+n-1}$$

$$X_2 = \{X_2^i\}_{i=l}^{i=l+n-1}$$

with the joint probability distribution $p(x_1, x_2)$. Without loss of generality, it may be assumed that $l=1$. To simplify notation, n may be implied by the context if no confusion arises. The $i^{th}$ element of $x_j$ will be referred to herein as $x_{ji}$. Different n-sequences of $X_j$ may be expressed as $x_j^1$, $x_j^2$, and so on. Since the sequence $(x_1, x_2)$ is drawn as independently and identically distributed (i.i.d.) sets according to $p(x_1, x_2)$, the joint probability distribution may be expressed as:

$$p(x_1, x_2) = \prod_{i=1}^{n} p(x_{1i}, x_{2i})$$

The characteristic graph $G_{X_1} = (V_{X_1}, E_{X_1})$ of $X_1$ with respect to $X_2$, $p(x_1, x_2)$, and function $f(X_1, X_2)$ may then be defined as follows: $V_{X_1} = \chi_1$ and an edge $(x_1^1, x_1^2) \in \chi_1^2$ is in $E_{X_1}$ if there exists an $x_2^1 \in \chi_2$ such that $p(x_1^1, x_2^1)p(x_1^2, x_2^1) > 0$ and $f(x_1^1, x_2^1) \neq f(x_1^2, x_2^1)$. In other words, in order to avoid confusion about the function $f(X_1, X_2)$ at the receiver, if $(x_1^1, x_1^2) \in E_{X_1}$, then descriptions of $x_1^1$ and $x_1^2$ must be different.

A vertex coloring of a graph may be defined as a function $$c_{G_{X_1}}(X_1): V_{X_1} \to N$$

of a graph $Gx_1 = (Vx_1, Ex_1)$ such that $(x_1^1, x_1^2) \in Ex_1$ implies $$c_{G_{X_1}}(x_1^1) \neq c_{G_{X_1}}(x_1^2).$$

The entropy of a coloring is the entropy of the induced distribution on colors. Here, $$p(c_{G_{X_1}}(x_1^j)) = p(c_{G_{X_1}}^{-1}(c_{G_{X_1}}(x_1^j))),$$

where $$c_{G_{X_1}}^{-1}(x_1^j) = \{x_1^j : c_{G_{X_1}}(x_1^j) = c_{G_{X_1}}(x_1^i)\}$$

for all valid j is called a color class. The set of all valid colorings of a graph $Gx_1$ may be denoted as $$C_{G_{X_1}}.$$

It may be desired at times to consider sequences of a random variable with length n. In order to deal with these cases, the definition of a characteristic graph can be extended for vectors of a RV. The $n^{th}$ power of a graph $G_{X_1}$ may be defined as a graph $G_{X_1}^n = (V_{X_1}^n, E_{X_1}^n)$ such that $V_{X_1}^n = \chi_1^n$ and $(x_1^1, x_1^2) \in E_{X_1}^n$ when there exists at least one i such that $(x_{1i}^1, x_{1i}^2) \in E_{X_1}$. A valid coloring of graph $G_{X_1}^n$ will be denoted by $$c_{G_{X_1}^n}(X_1).$$

Given a characteristic graph $Gx_1$ (or its n-th power, $G_{X_1}^n$), one can assign different colors to its vertices. Suppose $$C_{G_{X_1}}$$

is the collection of all valid colorings of this graph, $Gx_1$. Among these colorings, the one which minimizes the entropy of the coloring random variable is called the "minimum-entropy coloring," which may be expressed as:

$$c_{G_{X_1}}^{min} = \underset{c_{G_{X_1}} \in C_{G_{X_1}}}{\operatorname{argmin}} H(c_{G_{X_1}}).$$

where H is the entropy function. As described previously, the problem is how to compute $$c_{G_{X_1}}^{min}$$

given $Gx_1$.

As described above, it has been found that, in a case where the joint probability condition of the various random variables of a system is non-zero for all possible variable combinations (i.e., for all $(x_1, x_2) \in \chi_1 \times \chi_2$, $p(x_1, x_2) > 0$), the minimum entropy coloring of the characteristic graph of a random variable is tractable and easy to compute. In such a case, the maximal independent sets of the characteristic graph $G_{X_1}$ (and, its $n^{th}$ power $G_{X_1}^n$, for any n) are non-overlapping fully-connected sets. Under this condition, the minimum entropy coloring can be achieved by assigning different colors to the different maximal independent sets. As shown below, this can be proven using contradiction.

Figure 5A:
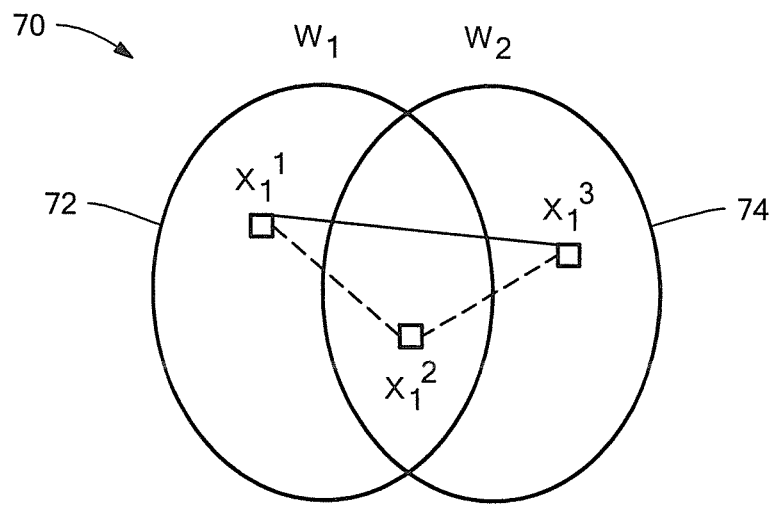
FIG. 5a is a diagram illustrating elements of a characteristic graph having overlapping maximal independent sets.

FIG. 5a is a diagram illustrating elements of a characteristic graph 70 having overlapping maximal independent sets 72, 74 ($w_1$, $w_2$). Suppose $\Gamma(G_{X_1})$ is the set of all maximal independent sets of $G_{X_1}$. With reference to FIG. 5a, suppose that $w_1$ and $w_2$ are two different non-empty maximal independent sets. Assume $x_1^1$ and $x_1^2$ are in $w_1$ and $x_1^2$ and $x_1^3$ are in $w_2$. In other words, these sets have a common element $x_1^2$. Since $w_1$ and $w_2$ are two different maximal independent sets, $x_1^1 \notin w_2$ and $x_1^3 \notin w_1$. Since $x_1^1$ and $x_1^2$ are in $w_1$, there is no edge between them in $G_{X_1}$. The same argument holds for $x_1^2$ and $x_1^3$. But, there is an edge between $x_1^1$ and $x_1^3$, because $w_1$ and $w_2$ are two different maximal independent sets, and such an edge should exist between them. Now, it will be shown that this situation is not possible.

Since there is no edge between $x_1^1$ and $x_1^2$, for any $x_2^1 \in \chi_2$, $p(x_1^1, x_2^1)p(x_1^2, x_2^1) > 0$, and $f(x_1^1, x_2^1) = f(x_1^2, x_2^1)$. A similar condition holds for $x_1^2$ and $x_1^3$. In other words, for any $x_2^1 \in \chi_2$, $p(x_1^2, x_2^1)p(x_1^3, x_2^1) > 0$, and $f(x_1^2, x_2^1) = f(x_1^3, x_2^1)$. Thus, for all $x_2^1 \in \chi_2$, $p(x_1^1, x_2^1)p(x_1^3, x_2^1) > 0$, and $f(x_1^1, x_2^1) = f(x_1^3, x_2^1)$. However, since $x_1^1$ and $x_1^3$ are connected to each other, there should exist a $x_2^1 \in \chi_2$ such that $f(x_1^1, x_2^1) \neq (x_1^3, x_2^1)$, which is not possible. So, the contradiction assumption is not correct and these two maximal independent sets do not overlap each other.

Figure 5B:
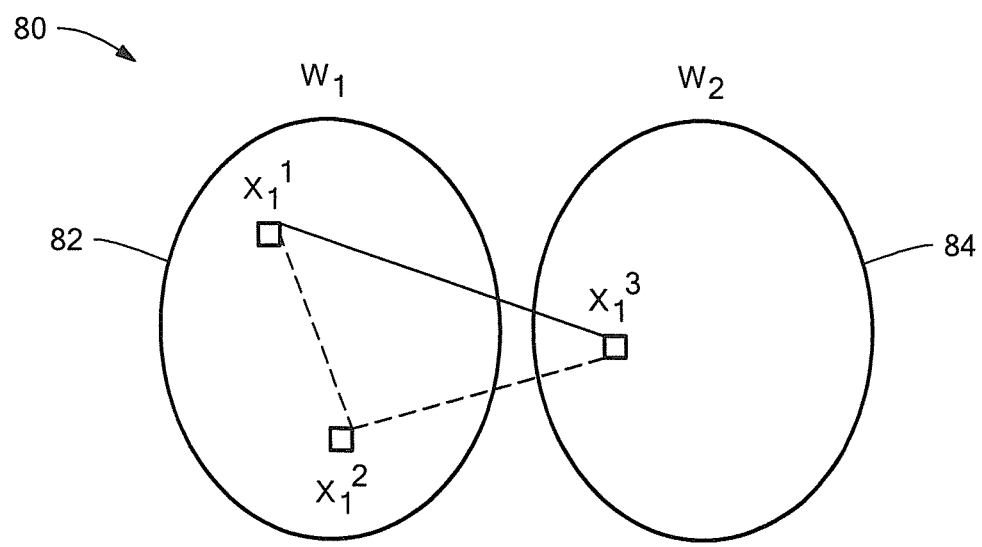
FIG. 5b is a diagram illustrating elements of a characteristic graph having non-overlapping maximal independent sets.

Above, it is shown that maximal independent sets cannot have overlaps with each other. Now, it will be shown that the maximal independent sets are also fully connected to each other. Again, this will be done by contradiction. FIG. 5b is a diagram illustrating elements of a characteristic graph 80 having non-overlapping maximal independent sets 82, 84 ($w_1$, $w_2$). Suppose that there exists an element in $w_2$ (e.g., $x_1^3$) which is connected to one of elements in $w_1$ (e.g., $x_1^1$) and is not connected to another element of $w_1$ (e.g., $x_1^2$). For reasons similar to those described in the previous paragraph, this situation is not possible. Thus, $x_1^3$ should be connected to $x_1^1$. Therefore, based on the above, if for all $(x_1, x_2) \in \chi_1 \times \chi_2$, $p(x_1, x_2) > 0$, then the maximal independent sets of $G_{X_1}$ are separate fully connected sets. In other words, the complement of $G_{X_1}$ is formed by some non-overlapping cliques. The minimum entropy coloring of this graph may thus be found in a relatively simple manner and can be achieved by assigning different colors to these non-overlapping fully-connected maximal independent sets.

This argument also holds for any power of $G_{X_1}$. Suppose $x_1^1$, $x_1^2$, and $x_1^3$ are some typical sequences in $\chi_1^n$. If $x_1^1$ is not connected to $x_1^2$ and $x_1^3$, it is not possible to have $x_1^2$ and $x_1^3$ connected. Therefore, one can apply a similar argument to prove the theorem for $G_{X_1}^n$, for some n.

In the case discussed above where the joint probability condition of the various random variables of a system is non-zero for all possible variable combinations, only the probability distribution is restricted and not the function $f$. Thus, for any function $f$ at the terminal node, if there is a non-zero joint probability distribution of source random variables (e.g., when the source RVs are independent), finding the minimum-entropy coloring and, therefore, the proposed functional compression scheme is easy and tractable.

Figure 6A:
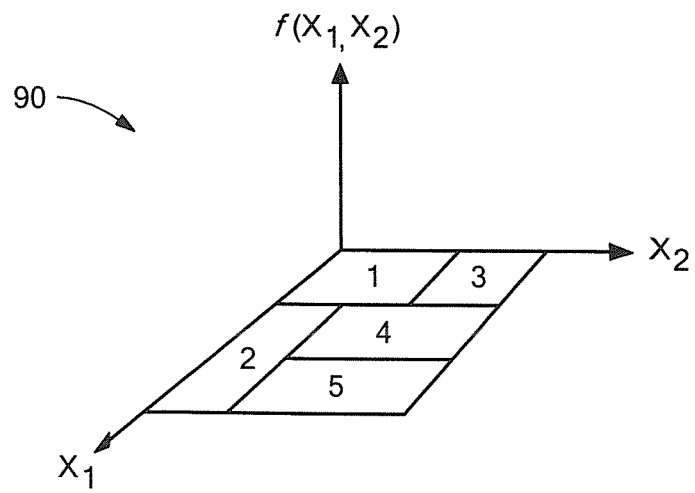
FIGS. 6a and 6b are diagrams illustrating example quantization functions in accordance with one or more implementations.
Figure 6B:
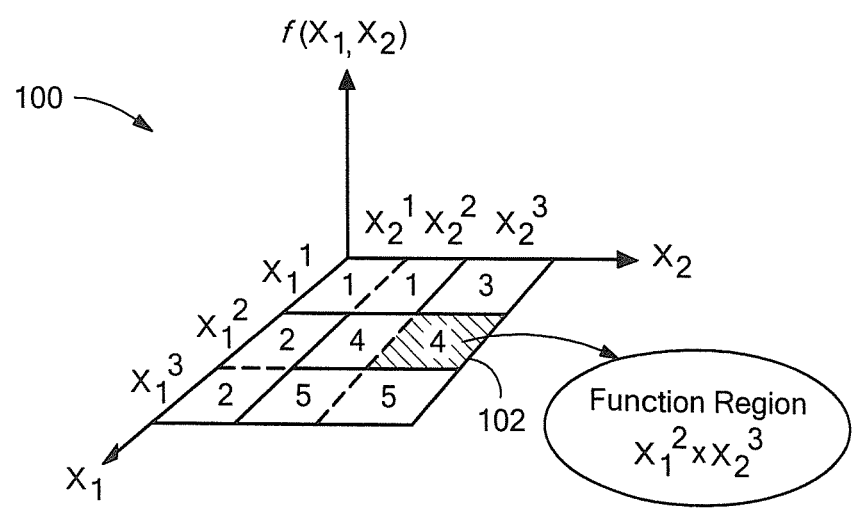

As described above, it has been found that, in cases where the network function being computed in the terminal node is a quantization function, the minimum entropy coloring of the characteristic graph of a source random variable is tractable and easy to compute. A natural quantization function is a function which separates the $X_1$-$X_2$ plane into rectangles, such that each rectangle corresponds to a different value of the function. Sides of these rectangles are parallel to the plane axes. FIG. 6a depicts an example quantization function 90 of this type in accordance with an implementation. For a given quantization function, the sides of each rectangle may be extended in the $X_1$-$X_2$ plane to form some new rectangles. The new rectangles may be referred to as function regions. Each function region can be determined by two subsets of $\chi_1$ and $\chi_2$. FIG. 6b depicts an example quantization function 100 having function regions, where one of the function regions is shown as shaded area 102.

For two function regions $\chi_1^1 \times \chi_2^1$ and $\chi_1^2 \times \chi_2^2$, if for any $x_1^1 \in \chi_1^1$ and $x_1^2 \in \chi_1^2$, there exists an $x_2$ such that $p(x_1^1, x_2) p(x_1^2, x_2) > 0$ and $f(x_1^1, x_2) \neq f(x_1^2, x_2)$, it will be said that these two function regions are pairwise $X_1$-proper. For a quantization function $f$ that has function regions that are pairwise $X_1$-proper, $G_{X_1}^n$ (and $G_{X_1}^n$, for any n) is formed of some non-overlapping fully connected maximal independent sets, and its minimum entropy coloring can be achieved by assigning different colors to different maximal independent sets. A proof of this statement follows.

The statement will first be proven for $G_{X_1}$. Suppose $\chi_1^1 \times \chi_2^1$ and $\chi_1^2 \times \chi_2^2$ are two $X_1$-proper function regions of a quantization function $f$, where $\chi_1^1 \neq \chi_1^2$. It will be shown that $\chi_1^1$ and $\chi_1^2$ are two non-overlapping fully-connected maximal independent sets. By definition, $\chi_1^1$ and $\chi_1^2$ are two non-equal partition sets of $\chi_1$. Thus, they do not have any element in common. Now, it will be shown that vertices of each of these partition sets are not connected to each other. Without loss of generality, this can be shown for $\chi_1^1$. In a trivial case, the partition set of $\chi_1$ will have only one element. So, suppose $x_1^1$ and $x_1^2$ are two elements in $\chi_1^1$. By the above described definition of function regions, it can be seen that, for any $x_2 \in \chi_2$ such that $p(x_1^1, x2) p(x_1^2, x_2) > 0$, then $f(x_1^1, x_2) = f(x_1^2, x_2)$. Therefore, these two vertices are not connected to each other.

Now, suppose $x_1^3$ is an element in $\chi_1^2$. Since these function regions are $X_1$-proper, there should exist at least one $x_2 \in \chi_2$, such that $p(x_1^1, x_2) p(x_1^3, x_2) > 0$, and $f(x_1^1, x_2) \neq f(x_1^3, x_2)$. Thus, $x_1^1$ and $x_1^3$ are connected to each other and $\chi_1^1$ and $\chi_1^2$ are two non-overlapping fully connected maximal independent sets. This same analysis can easily be applied to the other partition sets. Thus, the minimum entropy coloring can be achieved by assigning different colors to different maximal independent sets (i.e., partition sets). The proof for $G_{X_1}^n$, for any n, is similar to the one described above.

It should be appreciated that, in the above analysis, without the $X_1$-proper condition, assigning different colors to different partitions may still lead to an achievable coloring scheme. However, it is not necessarily a minimum entropy coloring. In other words, without this condition, maximal independent sets may overlap.

Figure 7:
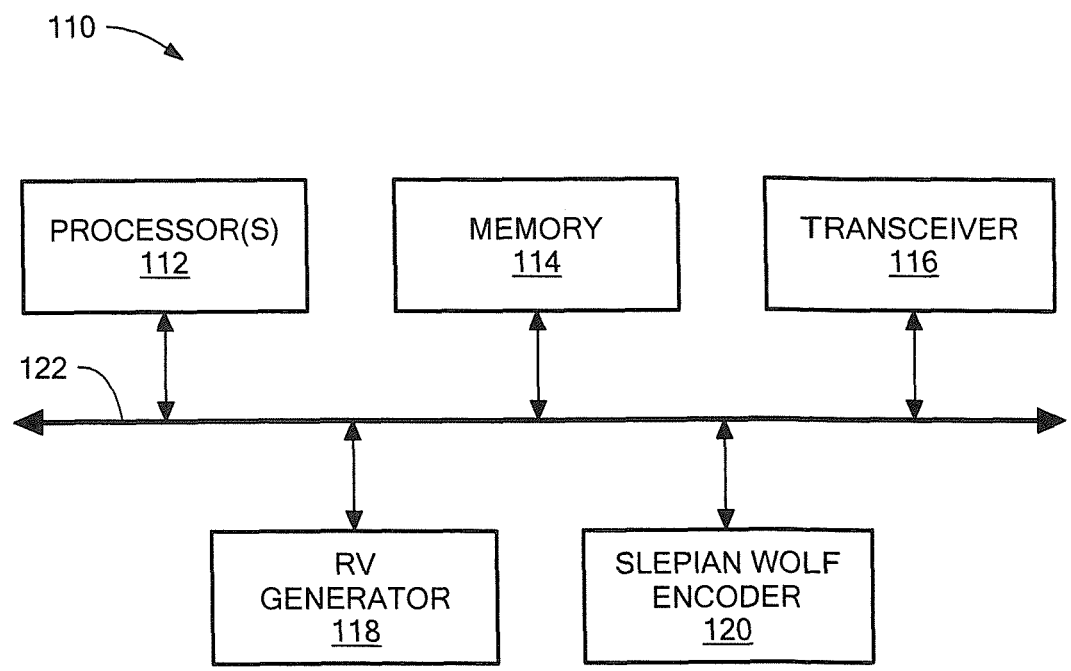
FIG. 7 is a block diagram illustrating an example node device architecture in accordance with an implementation.

FIG. 7 is a block diagram illustrating an example node device architecture 110 that may be used for a node device in accordance with an implementation. The node device architecture 110 may be used, for example, for the source nodes 12, 14, 16, 18 or the intermediate nodes 22, 24 of network 10 of FIG. 1 in an implementation. As illustrated, node device architecture 110 may include: one or more digital processors 112, a memory 114, a transceiver 116, a random variable (RV) generator 118, and an encoder 120. A bus 122 and/or other communication media may be provided to allow the various components of architecture 110 to communicate with one another. Digital processor(s) 112 may include one or more digital processing devices. Memory 114 may include one or more digital data storage system, devices, and/or components that may be used to store data and/or programs for other components of node device architecture 110. Transceiver 116 is operative for supporting communication with one or more remote nodes in a network. Transceiver 116 may be used, for example, to transmit information (e.g., compressed random variable data, etc.) to a remote node for use in a functional compression application. Transceiver 116 may also include receiver functionality for use in receiving compressed information from another node device in a network. Transceiver 116 may be wired or wireless.

Digital processor(s) 112 is operative for, among other things, executing programs and procedures for a corresponding node device. Digital processor(s) 112 may be used to, for example, execute an operating system and/or one or more application programs for a node device. In addition, digital processor(s) 112 may be used to implement, either partially or fully, one or more of the functional compression related processes or techniques described herein in some implementations (e.g., some or all of method 30 of FIG. 2, method 50 of FIG. 3, etc.). Digital processor(s) 112 may include, for example, one or more digital signals processors (DSPs), general purpose microprocessors, application specific integrated circuits (ASICs), field programmable gate arrays (FPGAs), controllers, microcontrollers, programmable logic arrays (PLAs), programmable logic devices (PLDs), reduced instruction set computers (RISCs), and/or other processing devices or systems, including combinations of the above.

As described above, transceiver 116 may include any type of transceiver that is capable of communicating with a remote node in a network. In some implementations, one or more wireless transceivers may be provided. In wireless implementations, transceiver 116 may be configured in accordance with one or more wireless networking standards and/or wireless cellular standards. In some implementations, multiple wireless transceivers may be provided to support operation in different networks or systems in a surrounding environment or with different wireless networking and/or cellular standards.

Memory 114 may include any type of system, device, or component, or combination thereof, that is capable of storing digital information (e.g., digital data, computer executable instructions and/or programs, etc.) for access by a processing device or other component. This may include, for example, semiconductor memories, magnetic data storage devices, disc based storage devices, optical storage devices, read only memories (ROMs), random access memories (RAMs), non-volatile memories, flash memories, USB drives, compact disc read only memories (CD-ROMs), DVDs, Blu-Ray disks, magneto-optical disks, erasable programmable ROMs (EPROMs), electrically erasable programmable ROMs (EEPROMs), magnetic or optical cards, and/or other digital storage suitable for storing electronic instructions and/or data.

RV generator 118 is operative for generating a random variable for a node device in accordance with an implementation. The random variable data generated by RV generator 118 may then be compressed for transmission to a remote node in the network using techniques described herein. Any type of random variable may be generated. As described previously, for example, in one possible application, the RV generator 118 may include a temperature sensor for sensing a temperature in an area of interest. Other types of sensors, or combinations of sensors, may alternatively be used. In some applications, RV generator 118 may include a database that stores data about one or more subjects. For example, some nodes in a network may include databases that include medical records of patients. It may be desired to compute a function at a remote node based on information within these databases. Functional compression may be used to compress the patient data before transmission to the remote node. By using functional compression, privacy may be enhanced by reducing an amount of sensitive information being transmitted within the network. Many other forms of random variables and random variable generators may be used in other implementations.

Encoder 120 may include any type of encoder that may be used to encode/compress random variable data to be transmitted to a remote node. In the illustrated implementation, a Slepian-Wolf encoder is used. Encoder 120 may be implemented as a separate unit or it may be implemented within digital processor(s) 112.

It should be appreciated that the node device architecture 110 of FIG. 7 represents one possible example of an architecture that may be used in an implementation. Other architectures may alternatively be used. As used herein, the term "node device" or "node" is used to describe any type of digital electronic device that includes some form of communication capability (wireless and/or wired). This may include, for example, a laptop, desktop, notebook, or tablet computer; a personal digital assistant (PDA); a personal communication service (PCS) device; a personal navigation assistant (PNA); a cellular telephone, smart phone, or other wireless communication device; a pager; a wireless sensor device; a satellite communication device; a media player having communication capability; a digital storage device with communication capability, a radio frequency identification (RFID) reader or tag; and/or other devices. It should be appreciated that all or part of the various devices, processes, or methods described herein may be implemented using any combination of hardware, firmware, and/or software. In at least one implementation, a computer readable medium or media may be provided having instructions stored thereon for carrying out a method in accordance with the concepts and techniques described herein.

Having described exemplary embodiments of the invention, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

What is claimed is:

1. In a network having multiple source nodes that each generate a random variable and that are to transmit information to a receiver node that will allow the receiver node to compute a function of the random variables, a method for compressing and transmitting data at a first node of the network, comprising:
   generating a characteristic graph for a random variable associated with the first node of the network with respect to random variables associated with other nodes of the network, a joint probability distribution between random variables of the network, and the function of the random variables that is to be computed at the receiver node, wherein the vertices of the characteristic graph are the possible values of the random variable associated with the first node;
   determining a minimum entropy coloring of the characteristic graph for the random variable associated with the first node, wherein determining a minimum entropy coloring of the characteristic graph includes:
      identifying maximal independent sets of the characteristic graph for the random variable associated with the first node; and
      assigning a different color to the vertices of each identified maximal independent set;
   encoding the minimum entropy coloring of the characteristic graph to generate an encoded minimum entropy coloring of the characteristic graph; and
   transmitting the encoded minimum entropy coloring of the characteristic graph for the random variable associated with the first node to another node in the network.

2. The method of claim 1, wherein:
   the random variables associated with the multiple source nodes have a non-zero joint probability distribution with respect to one another.

3. The method of claim 1, wherein:
   the function of the random variables associated with the multiple source nodes is a quantization function.

4. The method of claim 1, further comprising:
   checking a coloring connectivity condition of the characteristic graph after generating the characteristic graph, wherein encoding the minimum entropy coloring of the characteristic graph and transmitting the encoded minimum entropy coloring of the characteristic graph are only performed if the coloring connectivity condition is satisfied.

5. The method of claim 1, wherein:
   encoding the minimum entropy coloring of the characteristic graph to generate an encoded minimum entropy coloring of the characteristic graph includes encoding the minimum entropy coloring using a Slepian-Wolf code.

6. A node device for use in a network having multiple source nodes and a receiver node, the multiple source nodes to each generate a random variable and to transmit information to the receiver node that will allow the receiver node to calculate a function of the random variables, the node device comprising:
- a first processor to generate a characteristic graph for a random variable associated with the node device, wherein the characteristic graph is generated with respect to other random variables in the network, the joint probability distributions $p(x_1, x_2)$ between the random variables, and a network function to be calculated at the receiver node;
- a second processor to determine a minimum entropy coloring of the characteristic graph, wherein the second processor determines the minimum entropy coloring by first identifying maximal independent sets of the characteristic graph for the random variable and then assigning a different color to the vertices of each identified maximal independent set;
- an encoder to encode the minimum entropy coloring of the characteristic graph to generate an encoded minimum entropy coloring; and
- a transmitter to transmit the encoded minimum entropy coloring to another node in the network.

7. The node device of claim 6, further comprising:
a random variable generator to generate the random variable.

8. The node device of claim 6, wherein:
the encoder is a Slepian-Wolf encoder.

9. The node device of claim 6, wherein:
the first and second processors are the same processor.

10. The node device of claim 6, wherein:
the random variable generator includes a sensor to sense a parameter value.

11. The node device of claim 6, wherein:
the random variable generator includes a database.

12. The node device of claim 6, wherein:
the random variables associated with the multiple source nodes have a non-zero joint probability distribution with respect to one another.

13. The node device of claim 6, wherein:
the function of the random variables associated with the multiple source nodes is a quantization function.

14. The node device of claim 6, wherein the transmitter is a wireless transmitter.

15. A non-transitory computer readable medium for use in connection with a network having multiple source nodes that each generate a random variable and that are to transmit information to a receiver node that will allow the receiver node to compute a function of the random variables, the computer readable medium having instructions stored thereon that, when executed by a computer, perform the method of:
- generating a characteristic graph for a random variable associated with a first node of the network with respect to random variables associated with other nodes of the network, a joint probability distribution between random variables of the network, and the function of the random variables that is to be computed at the receiver node, wherein the vertices of the characteristic graph are the possible values of the random variable associated with the first node;
- determining a minimum entropy coloring of the characteristic graph for the random variable associated with the first node, wherein determining a minimum entropy coloring of the characteristic graph includes:
  - identifying maximal independent sets of the characteristic graph for the random variable associated with the first node; and
  - assigning a different color to the vertices of each identified maximal independent set;
- encoding the minimum entropy coloring of the characteristic graph to generate an encoded minimum entropy coloring of the characteristic graph; and
- transmitting the encoded minimum entropy coloring of the characteristic graph for the random variable associated with the first node to another node in the network.

* * * * *